(12) United States Patent
Bryant et al.

(10) Patent No.: US 6,475,838 B1
(45) Date of Patent: Nov. 5, 2002

(54) METHODS FOR FORMING DECOUPLING CAPACITORS

(75) Inventors: Andres Bryant, Essex Junction, VT (US); William F. Clark, Jr., Essex Junction, VT (US); Edward J. Nowak, Essex Junction, VT (US); Minh H. Tong, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/525,103

(22) Filed: Mar. 14, 2000

(51) Int. Cl.⁷ .............................................. H01L 21/62
(52) U.S. Cl. ........................................ 438/153; 438/395
(58) Field of Search .................................. 438/155, 252, 438/395, FOR 220, 153

(56) References Cited

U.S. PATENT DOCUMENTS

| | | | |
|---|---|---|---|
| 4,785,202 A | 11/1988 | Toyoda | |
| 5,759,907 A | 6/1998 | Assaderaghi et al. | |
| 5,770,875 A | 6/1998 | Assaderaghi et al. | |
| 5,770,881 A | 6/1998 | Pelella et al. | |
| 5,789,807 A | 8/1998 | Correale, Jr. | |
| 5,789,964 A | 8/1998 | Voldman | |
| 5,792,693 A | 8/1998 | Tseng | |
| 5,841,182 A | 11/1998 | Linn et al. | |
| 6,096,584 A | * 8/2000 | Ellis-Monaghan et al. | .. 438/151 |
| 6,159,807 A | * 12/2000 | Bryant et al. | ............... 438/289 |

* cited by examiner

Primary Examiner—George Fourson
(74) Attorney, Agent, or Firm—Dugan & Dugan; Mark F. Chadurjian; Kelly M. Reynolds

(57) ABSTRACT

A decoupling capacitor and methods for forming the same are provided. In a first aspect, the decoupling capacitor is formed during a process for forming first and second type FETs on a common substrate that comprises a plurality of implant steps for doping channels and diffusions of the first and second type FETs. In a second aspect, a method is provided for forming the novel decoupling capacitor that includes the steps of forming a mandrel layer on a substrate, including forming openings in the mandrel layer and disposing a first type dopant into the substrate through the openings. Thereafter, an epitaxial layer is formed in the openings on the substrate, an insulator layer is formed in the openings on the epitaxial layer and a gate is formed in the openings on the insulator layer. The mandrel layer is removed and the first type dopant is disposed into the substrate abutting the first type dopant in the substrate that was disposed through the openings. During this step the first type dopant is disposed into the gate. The substrate having the first type dopant comprises one terminal of the capacitor and the gate comprises another terminal of the capacitor.

17 Claims, 4 Drawing Sheets

US 6,475,838 B1

METHODS FOR FORMING DECOUPLING CAPACITORS

FIELD OF THE INVENTION

The present invention relates to integrated circuits, and more particularly to decoupling capacitors employed within integrated circuits and to methods for forming such decoupling capacitors.

BACKGROUND OF THE INVENTION

Complementary metal-oxide-semiconductor (CMOS) circuitry formed on silicon-on-insulator (SOI) substrates offers higher performance than CMOS circuitry formed on bulk substrates due to the lower junction capacitances of SOI-based devices and the increased switching speed associated therewith. This performance advantage is enabled by dielectrically isolating active circuits from the bulk substrate (e.g., via a buried oxide layer).

While the use of SOI substrates improves the switching characteristics of CMOS circuitry, the use of SOI substrates is not entirely beneficial. For example, compared to devices formed on bulk substrates, SOI-based devices have higher diode resistances, reduced thermal conduction dissipation and very low on-chip decoupling capacitances between power supply rails and ground. Electrostatic discharge (ESD) protection thereby is degraded for SOI-based devices (e.g., due to high diode resistances and poor thermal conduction), and on-chip noise and input/output (I/O) noise is larger for SOI-based devices (e.g., due to low on-chip decoupling capacitances).

ESD protection for SOI-based CMOS technology is described, for example, in U.S. patent application Ser. No. 09/334,078, filed Jun. 16, 1999 (IBM Docket No. BU9-98-213). However, a need for high capacitance, SOI-based decoupling capacitors remains.

SUMMARY OF THE INVENTION

To overcome the needs of the prior art, a novel decoupling capacitor and methods for forming the same are provided. The novel decoupling capacitor has a highly doped body region that decreases the RC time constant of the capacitor (increasing the switching speed of a device employing the decoupling capacitor), and that allows the decoupling capacitor to be formed in a small geometric area (increasing circuit density).

In a first aspect of the invention, the decoupling capacitor is formed during a process for forming first and second type FETs (e.g., p-channel and n-channel FETs) on a common substrate that comprises a plurality of implant steps for doping channels and diffusions of the first and second type FETs. To form the decoupling capacitor, an epitaxial layer is formed over a channel region of at least one of the first type FETs after a channel dopant is implanted into the channel region of the at least one of the first type FETs. Thereafter, a gate oxide layer is formed over the epitaxial layer, and a gate is formed over the gate oxide layer. A diffusion implant step for the first type FETs on the common substrate is blocked from the at least one of the first type FETS; and a diffusion implant step for the second type FETs on the common substrate is not blocked from the at least one of the first type FETs. The channel region together with diffusion regions of the at least one of the first type FETs forms one terminal of the capacitor, and the gate forms another terminal of the capacitor.

In a second aspect of the invention, a method is provided for forming the novel decoupling capacitor that includes the steps of forming a mandrel layer on a substrate, including forming openings in the mandrel layer and disposing a first type dopant into the substrate through the openings. Thereafter, an epitaxial layer is formed in the openings on the substrate, an insulator layer is formed in the openings on the epitaxial layer and a gate is formed in the openings on the insulator layer. The mandrel layer is removed and the first type dopant is disposed into the substrate abutting the first type dopant in the substrate that was disposed through the openings. During this step the first type dopant is disposed into the gate. The substrate having the first type dopant comprises one terminal of the capacitor and the gate comprises another terminal of the capacitor.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
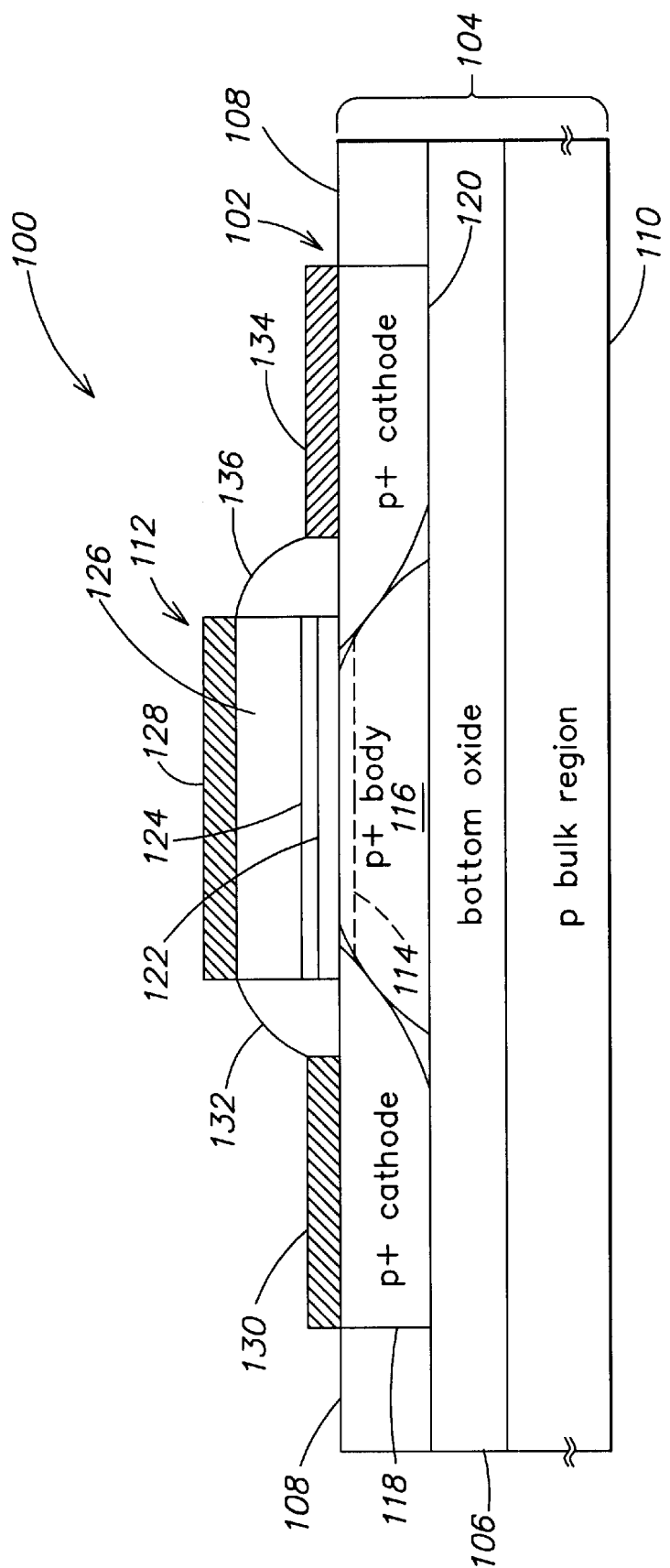
FIG. 1 is a cross sectional view of an inventive decoupling capacitor formed in accordance with the present invention.

FIG. 1 is a cross sectional view of an inventive decoupling capacitor 100 formed in accordance with the present invention. The inventive decoupling capacitor 100 comprises an isolated semiconductor region 102 formed from a substrate 104. Preferably the substrate 104 is a silicon-on-insulator (SOI) substrate in which a plurality of islands of semiconductor material, forming a plurality of the semiconductor regions 102, are isolated from electrical contact with each other by an underlying insulating layer 106 and surrounding trenches 108 (e.g., shallow isolated trench (STI) regions). The isolation material in the SOI insulating layer 106 and the trenches 108 is typically silicon dioxide. The SOI substrate may be made by any known SOI substrate construction technique.

With reference to FIG. 1, the semiconductor region 102 is disposed on the insulating layer 106 which typically is disposed on a bulk silicon region 110. The semiconductor region 102 is isolated from the bulk silicon region 110 of the substrate 104 by the underlying insulating layer 106. The isolation of the semiconductor region 102 may also be achieved through the use of triple well technology in which the isolation is provided by multiple p-n boundaries.

The inventive decoupling capacitor 100 further comprises a gate structure 112 formed over a channel region 114 (shown in phantom) of a body region 116 of the isolated semiconductor region 102, and first and second diffusion regions 118, 120 formed within the isolated semiconductor region 102 which contact the body region 116. Note that the body region 116, the first diffusion region 118 and the second diffusion region 120 all have the same conductivity-type (e.g., p-type, although n-type also may be employed).

As described further below with reference to FIGS. 2A–2E, the gate structure 112 preferably comprises an epitaxial layer 122 formed over the channel region 114, a gate oxide 124 formed over the epitaxial layer 122, a gate metal (preferably a polysilicon layer 126) formed over the gate oxide 124 and a first silicide contact 128 formed over the polysilicon layer 126. A second silicide contact 130 preferably is formed over the first diffusion region 118 and is spaced from the gate structure 112 via a first spacer 132 (e.g., a nitride or an oxide), and a third silicide contact 134 preferably is formed over the second diffusion region 120 and is spaced from the gate structure 112 via a second spacer 136. The preferred process for forming the inventive decoupling capacitor 100, as well as the preferred characteristics of the various materials employed therein (e.g., material thickness, doping level, material type, etc.) are described below with reference to FIGS. 2A–2E.

To employ the inventive decoupling capacitor 100, a first voltage terminal (e.g., a ground terminal) is coupled to the body region 116, the first diffusion region 118 and the second diffusion region 120 (e.g., via the second silicide contact 130 and the third silicide contact 134), and a second voltage terminal (e.g., a $V_{DD}$ terminal) is coupled to the gate structure 112 (e.g., via the first silicide contact 128). The body region 116, the first diffusion region 118 and the second diffusion region 120 thus form one terminal of the inventive decoupling capacitor 100 and the gate structure 112 forms a second terminal of the inventive decoupling capacitor 100. As described further below, unlike the body region of conventional NFET decoupling capacitor, the body region 116 of the inventive decoupling capacitor 100 has a low resistance so that the RC time constant of the inventive decoupling capacitor 100 is small, and the switching speed of the inventive decoupling capacitor 100 is high. The surface area of the inventive decoupling capacitor 100 required for high speed operation thereby is significantly reduced over that of a conventional NFET decoupling capacitor (which requires a large surface area to compensate for a high body resistance). Further, because the gate oxide 124 is formed over the epitaxial layer 122 rather than over the channel region 114, the quality of the gate oxide 124 remains high (e.g., in contrast to a conventional buried resistor (BR) capacitor's gate oxide which is formed directly over an implanted channel region as is known in the art).

FIGS. 2A–2E are sequential cross sectional views of the inventive decoupling capacitor 100 during a preferred formation process of the inventive decoupling capacitor 100. The inventive decoupling capacitor 100's formation process is similar to the self-aligned dynamic threshold CMOS device formation process described in U.S. patent application Ser. No. 09/157,691, filed Sep. 21, 1998 (IBM Docket No. BU9-97-229) (which is hereby incorporated by reference herein in its entirety). It will be understood that the inventive decoupling capacitor 100 may be formed by any other known process (e.g., a non-self aligned process).

Figure 2A:
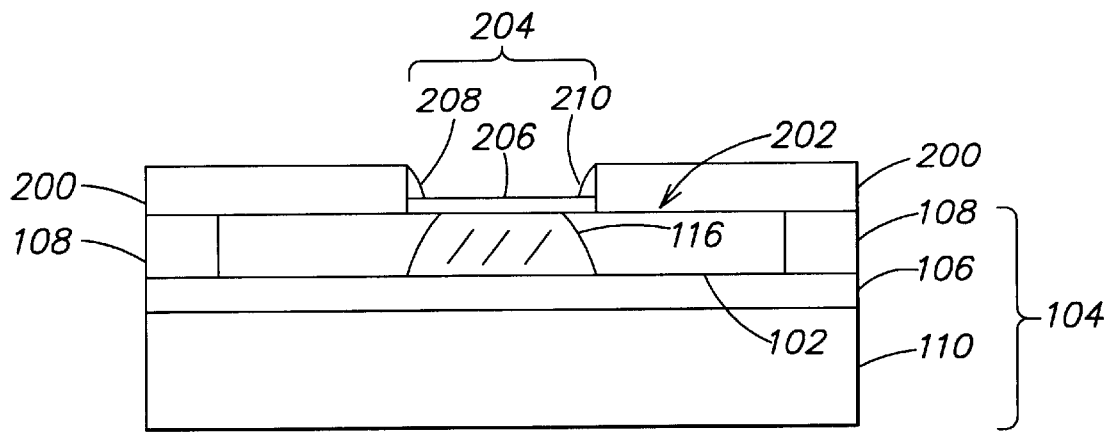
FIGS. 2A–2E are sequential cross sectional views of the inventive decoupling capacitor of FIG. 1 during a preferred formation process of the inventive decoupling capacitor.

With reference to FIG. 2A, formation of the inventive decoupling capacitor 100 begins with the deposition of a mandrel layer 200 over an upper surface 202 of the isolated semiconductor region 102. Preferably the mandrel layer 200 comprises deposited silicon nitride which, in the preferred embodiment, has a thickness of about 200 nanometers.

After the mandrel layer 200 is applied, a gate opening 204 is-defined and etched into the mandrel layer 200. The gate opening 204 in the mandrel layer 200 defines the gate structure 112 and serves to maintain alignment of all the elements of the gate structure 112 during subsequent processing steps. The gate opening 204 is constructed using conventional techniques with resist and etching.

After the gate opening 204 is formed, a layer of sacrificial oxide 206 is formed (e.g., is deposited) in the gate opening 204 to protect the exposed surface 202. Spacer material (e.g., polysilicon) is then added and etched in a conventional manner to produce first and second spacers 208, 210 around the entire inner edge of the gate opening 204. The first and second spacers 208, 210 narrow the width of the gate opening, and need not be employed.

After the spacers 208, 210 are added to the gate opening 204, the highly doped body region 116 (with the channel 114 disposed therein) is formed in the gate opening 204, preferably by ion implantation of boron at a concentration of about $10^{15}/cm^2$ at 90 keV. In the embodiment shown, the highly doped body region 116 is a p+ region having a relatively low resistance. The low body resistance reduces the resistance associated with the inventive decoupling capacitor 100, thus improving the switching characteristics of the inventive decoupling capacitor 100.

Note that, if employed, the first and second spacers 208, 210 narrow the width of the gate opening 204 and may cause the width of the highly doped body region 116 to be less than the width of the gate opening 204. Accordingly, the spacers 208, 210 preferably are narrow enough to allow the highly doped body region 116 to directly abut the first and the second diffusion regions 118, 120 (the formation of which is described below) despite the narrowing of the gate opening 204. Such direct connection ensures a low resistance path between the diffusion regions 118, 120 and the body region 116, and reduces the overall resistance of the inventive decoupling capacitor 100. The abutment of the body region 116 to the first and the second diffusion regions 118, 120 can be seen in FIG. 1.

The semiconductor region 102 of the substrate 104 is isolated from adjacent semiconductor regions (described below) of the substrate 104 by the underlying oxide layer 106 and by the oxide trenches 108 on either side thereof. The oxide trenches 108 preferably are formed by conventional shallow trench isolation (STI) techniques.

Figure 2B:
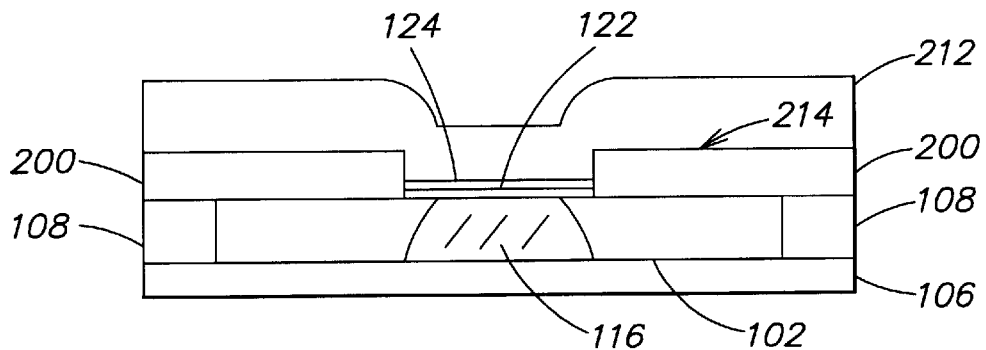

FIG. 2B shows the inventive decoupling capacitor 100 after several additional formation steps. After the highly doped p+ body region 116 is formed, the first and second spacers 208, 210 and the sacrificial oxide 206 are etched away. Although protection of the upper surface 202 during ion implantation with a layer of sacrificial oxide is preferred, the use of the sacrificial oxide 206 is optional.

After removal of the sacrificial oxide layer 206, a layer of p-type or n-type, as appropriate, monocrystalline silicon (e.g., the epitaxial layer 122) is epitaxially grown at a low temperature in the gate opening 204 so as to form a low-doped region of silicon above the highly-doped body region 116. In the preferred implementation of the invention, the epitaxial layer 122 is epitaxially grown at a temperature of about 500° C. to produce a layer approximately 25 nanometers thick having a p-type doping concentration of about $10^{15}$ cm$^{-3}$. The thickness and doping concentration are chosen to give desirable threshold-voltage characteristics, typically about 250 millivolts. Next, an insulating layer (forming the gate oxide 124) is created over the epitaxial layer 122 by either oxidation of the exposed silicon or by deposition of one or more insulating films (e.g., silicon nitride, a silicon nitride/silicon dioxide stack, etc.).

After production of the gate oxide 124, a first layer of conductive gate material 212 is deposited on the gate oxide 124 and the mandrel layer 200. This layer of gate material is deposited with a thickness approximately 20% greater than the thickness of the mandrel material so as to fill the gate opening 204. FIG. 2B shows the inventive decoupling capacitor 100 after deposition of the first layer of conductive gate material 212. The first layer of conductive gate material 212 may be either intrinsic polysilicon, n-doped polysilicon or a refractory material, such as tungsten.

Figure 2C:
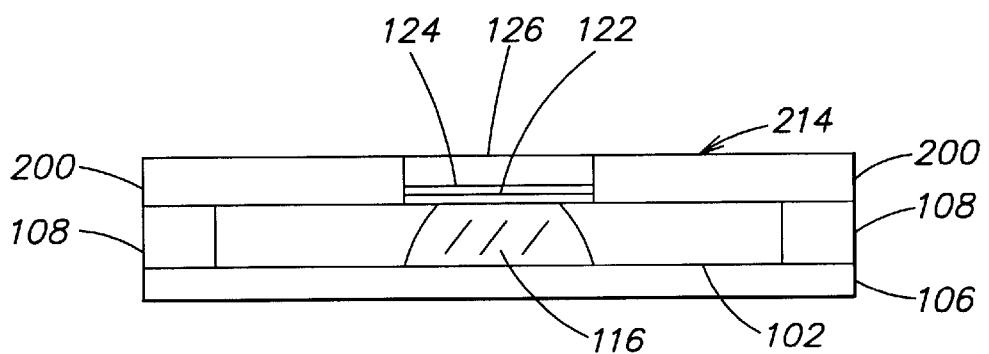

Following the production of the first layer of conductive gate material 212, the inventive decoupling capacitor 100 is planarized using chemical-mechanical polishing (CMP) with the mandrel layer 200 acting as an etch stop. This leaves a planar surface, level with an upper surface 214 of the mandrel layer 200, with the gate opening 204 filled with the first layer of conductive gate material 212 (e.g., so as to form the polysilicon layer 126) as shown in FIG. 2C. Thereafter, the mandrel layer 200 is removed (e.g., by etching), leaving the gate structure 112 exposed as shown in FIG. 2D.

Figure 2D:
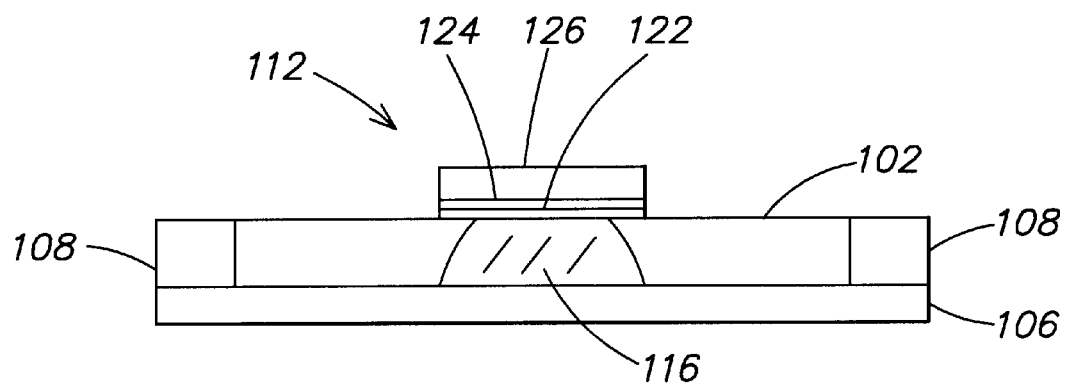
Figure 2E:
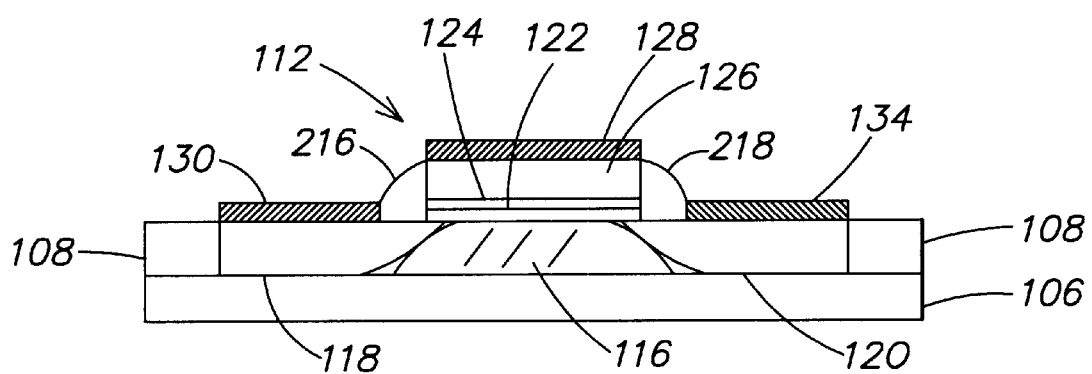

After creation of the gate structure 112 of FIG. 2D, the first and the second diffusion regions 118, 120 are formed on opposite sides of the gate structure 112. Specifically, spacer material is added and is etched in a conventional manner to produce third and fourth spacers 216, 218 (e.g., the spacers 132 and 136 of FIG. 1) around the outer edge of the gate structure 112. As with the first and the second spacers 208, 210 (FIG. 2A), the third and the fourth spacers 216, 218 need not be employed.

After the spacers 216, 218 are added adjacent the gate structure 112, the first diffusion region 118 and the second diffusion region 120 are formed, preferably by ion implantation of boron at a concentration of about $10^{15}$/cm$^2$ at 90 keV. The boron is also disposed into the gate structure 112 during this step. In the embodiment shown, the first diffusion region 118 and the second diffusion region 120 are highly doped p+ regions having a relatively low resistance; and the first diffusion region 118 and the second diffusion region 120 contact the highly doped body region 116. In this manner, a low resistance "first terminal" of the inventive decoupling capacitor 100 is formed by the body region 116, the first diffusion region 118 and the second diffusion region 120.

Note that, if employed, the second and the third spacers 216 and 218 preferably are narrow enough to ensure that the first diffusion region 118 and the second diffusion region 120 directly abut the body region 116 as shown in FIG. 1. Other factors which influence whether the first diffusion region 118 and the second diffusion region 120 directly abut the body region 116 include angle of implant, depth of implant, the thermal cycle employed during diffusion drive-in, etc.

When the gate material is doped polysilicon, a conventional silicidation process preferably is employed in which a suitable metal, such as titanium or cobalt, is deposited over the entire surface of the diffusion regions 118, 120 and the gate structure 112. The deposited metal is then sintered, typically at about 700° C., and the unreacted metal is selectively removed by chemical etching. The first, the second and the third silicide contacts 128, 130 and 134 thereby are formed.

Figure 3A:
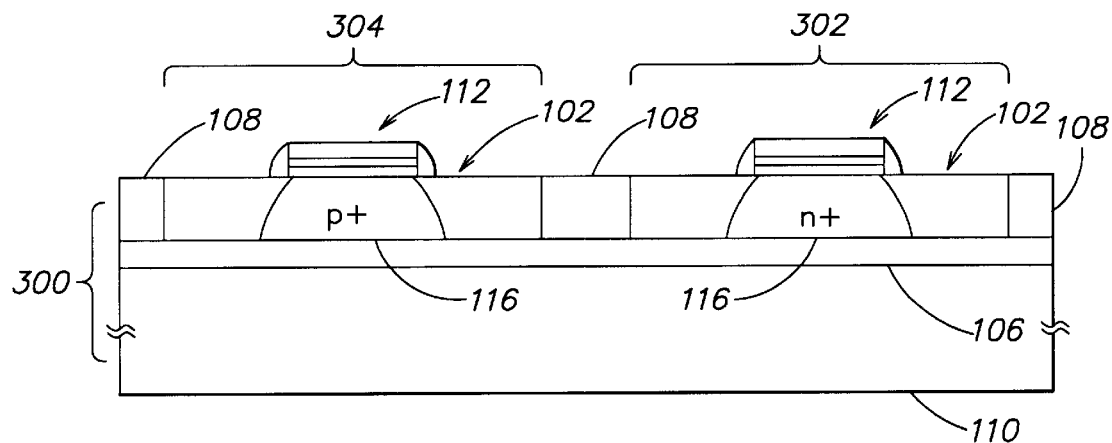
FIG. 3A is a cross sectional view of a substrate following the initial formation stages of a p-channel MOSFET (PFET) in a PFET region of the substrate and an n-channel MOSFET (NFET) in an NFET region of the substrate.

The above process may be easily implemented by modifying a CMOS fabrication process such as that described in previously incorporated U.S. patent application Ser. No. 09/157,691, filed Sep. 21, 1998 (IBM Docket No. BU9-97-229). For example, FIG. 3A shows a substrate 300 following the initial formation stages of a p-channel MOSFET (PFET) in a "PFET region 302" of the substrate 300 and of an n-channel MOSFET (NFET) in an "NFET region 304" of the substrate 300. The substrate 300 is an SOI substrate having an isolated semiconductor region 102 disposed on an underlying insulating layer 106, which in turn is disposed on a bulk silicon region 110. The PFET region 302 and the NFET region 304 are electrically isolated via isolation trenches 108 and the underlying insulating layer 106.

Figure 3B:
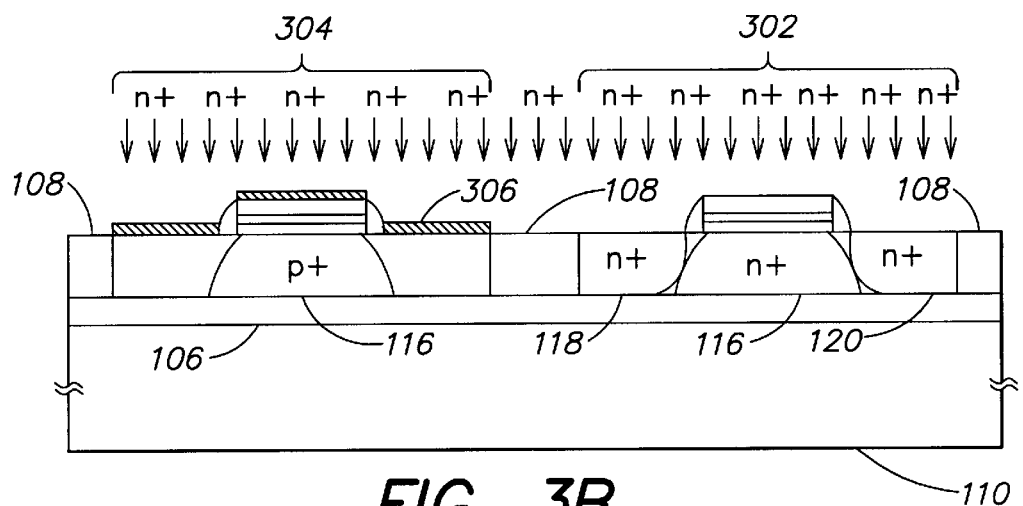
FIG. 3B illustrates a blocking process wherein a first photoresist layer blocks an n+ source/drain diffusion implant into an isolated semiconductor region of the NFET region of FIG. 3A.
Figure 3C:
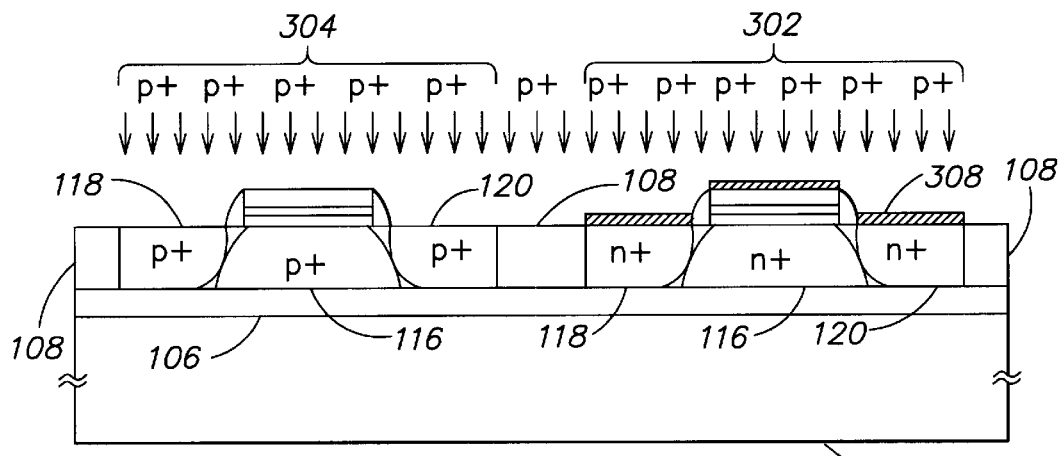
FIG. 3C illustrates a blocking process wherein a second photoresist layer blocks a p+ source/drain diffusion implant into an isolated semiconductor region of the PFET region of FIG. 3A.

At the stage of processing shown in FIG. 3A, a p+ body region 116 and a first gate structure 112 have been formed in the NFET region 304 (as previously described), and an n+ body region 116 and a second gate structure 112 have been formed in the PFET region 302. To form a PFET in the PFET region 302, p+ source and drain regions may be formed in the isolated semiconductor region 102 of the PFET region 302 via a p+ diffusion implant (while the p+ diffusion implant is blocked or masked from the isolated semiconductor region 102 of the NFET region 304), and to form an NFET in the NFET region 304, n+ source and drain regions may be formed in the isolated semiconductor region 102 of the NFET region 304 via an n+ diffusion implant (while the n+ diffusion implant is blocked or masked from the PFET region 302). However, in accordance with the present invention, an "n+ version" of the inventive decoupling capacitor 100 may be formed in the PFET region 302 by allowing the n+diffusion implant (conventionally used to form the n+ source and drain regions of the isolated semiconductor region 102 of the NFET region 304) to enter the isolated semiconductor region 102 of the PFET region 302, while blocking the p+diffusion implant conventionally used to form the p+ source and drain regions of the isolated semiconductor region 102 of the PFET region 302. Similarly, a "p+ version" of the inventive decoupling capacitor 100 may be formed in the NFET region 304 by allowing the p+ diffusion implant (conventionally used to form the p+ source and drain regions of the isolated semiconductor region 102 of the PFET region 302) to enter the isolated semiconductor region 102 of the NFET region 304, while blocking the n+ diffusion implant conventionally used to form the n+ source and drain regions of the isolated semiconductor region 102 of the NFET region 304. FIGS. 3B and 3C illustrate such a blocking process wherein a first photoresist layer 306 blocks the n+source/drain diffusion implant into the isolated semiconductor region 102 of the NFET region 304 (FIG. 3B), and wherein a second photoresist layer 308 blocks the p+source/drain diffusion implant into the isolated semiconductor region 102 of the PFET region 302 (FIG. 3C). The n+ and p+ versions of the inventive decoupling capacitor 100 preferably are completed by adding silicide contacts as previously described with reference to FIG. 2E.

The foregoing description discloses only the preferred embodiments of the invention, modifications of the above disclosed apparatus and method which fall within the scope of the invention will be readily apparent to those of ordinary skill in the art. For instance, while the fabrication processes described herein are preferred, any other fabrication processes may be similarly employed.

Accordingly, while the present invention has been disclosed in connection with the preferred embodiments thereof, it should be understood that other embodiments may fall within the spirit and scope of the invention, as defined by the following claims.

The invention claimed is:

1. A method comprising:

providing a substrate;

forming a mandrel layer on the substrate, including forming openings in the mandrel layer and disposing a first type dopant into the substrate through the openings;

forming an epitaxial layer in the openings on the substrate, including forming an insulator layer in the openings on the epitaxial layer and forming a gate in the openings on the insulator layer;

removing the mandrel layer and disposing the first type dopant into the substrate abutting the first type dopant in the substrate that was disposed through the openings, including disposing the first type dopant into the gate; and whereby the substrate having the first type dopant comprises one terminal of a capacitor and the gate comprises another terminal of the capacitor.

2. The method of claim 1 wherein the mandrel layer comprises silicon nitride.

3. The method of claim 1 wherein disposing a first type dopant into the substrate through the openings comprises implanting a first type dopant into the substrate through the openings.

4. The method of claim 3 further comprising forming a sacrificial oxide within the openings prior to implanting through the openings.

5. The method of claim 3 further comprising forming a spacer within the openings prior to implanting through the openings.

6. The method of claim 1 wherein the insulator layer comprises silicon dioxide.

7. The method of claim 1 wherein the gate comprises polysilicon.

8. The method of claim 1 wherein the substrate is an SOI substrate.

9. The method of claim 1, wherein said substrate has a first isolation structure below an upper surface.

10. The method of claim 9, further comprising forming second isolation structures that extend from said upper surface of said substrate to said first isolation structure.

11. The method of claim 1, wherein said step of forming said epitaxial layer is carried out at a temperature of approximately 500° C.

12. The method of claim 1, wherein said epitaxial layer has a thickness and doping concentration selected to provide a threshold voltage characteristic of about 250 millivolts.

13. The method of claim 12, wherein said thickness is approximately 25 manometers.

14. The method of claim 13, wherein said doping concentration is approximately $10^{15}$ cm$^{-3}$.

15. The method of claim 1, wherein said gate has a thickness approximately 20% greater than a thickness of said mandrel layer.

16. The method of claim 15, wherein said gate is etched so that it is co-planar with an upper surface of said mandrel layer prior to said step of removing said mandrel layer.

17. The method of claim 1, wherein prior to said step of disposing a first type dopant into said substrate abutting the first type dopant in the substrate, sidewall spacers are formed on sidewalls of said gate.

* * * * *